US012679998B2

(12) United States Patent
Guo et al.

(10) Patent No.: US 12,679,998 B2
(45) Date of Patent: Jul. 14, 2026

(54) SOLUBLE METAL OXIDE ANION CMP SLURRY

(71) Applicant: DuPont Electronic Materials Holding, Inc., Newark, DE (US)

(72) Inventors: Yi Guo, Newark, DE (US); Arthur W. Martin, Hockessin, DE (US)

(73) Assignee: DuPont Electronic Materials Holding, Inc., Newark, DE (US)

( * ) Notice: Subject to any disclaimer, the term of this patent is extended or adjusted under 35 U.S.C. 154(b) by 65 days.

(21) Appl. No.: 18/409,653

(22) Filed: Jan. 10, 2024

(65) Prior Publication Data

US 2026/0055301 A1 Feb. 26, 2026

(51) Int. Cl.
*C09G 1/02* (2006.01)
*C09G 1/04* (2006.01)
*H10P 52/40* (2026.01)
*H10P 95/00* (2026.01)

(52) U.S. Cl.
CPC ................. *C09G 1/02* (2013.01); *C09G 1/04* (2013.01); *H10P 52/402* (2026.01); *H10P 52/403* (2026.01); *H10P 95/04* (2026.01)

(58) Field of Classification Search
CPC ....... C09G 1/02; C09G 1/04; H01L 21/30625; H01L 21/32115; H01L 21/3212
USPC ......................... 438/690–693; 252/79.1–79.4
See application file for complete search history.

(56) References Cited

U.S. PATENT DOCUMENTS

| | | | | |
|---|---|---|---|---|
| 7,186,653 | B2 * | 3/2007 | Jha | C23F 3/04 438/692 |
| 8,101,093 | B2 | 1/2012 | de Rege Thesauro et al. | |
| 10,214,663 | B2 | 2/2019 | Lan et al. | |
| 10,961,414 | B2 | 3/2021 | Takai et al. | |
| 11,254,840 | B2 | 2/2022 | Takai et al. | |
| 11,424,133 | B2 | 8/2022 | Takai et al. | |
| 11,597,854 | B2 | 3/2023 | Ward et al. | |
| 2002/0098701 | A1 | 7/2002 | Hasegawa | |
| 2002/0111024 | A1 | 8/2002 | Small et al. | |
| 2005/0211950 | A1 | 9/2005 | de Rege Thesauro et al. | |
| 2006/0076317 | A1 | 4/2006 | de Rege Thesauro et al. | |
| 2009/0047787 | A1 | 2/2009 | Li et al. | |
| 2011/0186542 | A1 | 8/2011 | Li et al. | |
| 2013/0045598 | A1 * | 2/2013 | Guo | C09G 1/02 438/693 |
| 2020/0181454 | A1 | 6/2020 | Ko et al. | |
| 2021/0035812 | A1 | 2/2021 | Kim et al. | |

(Continued)

FOREIGN PATENT DOCUMENTS

| | | | |
|---|---|---|---|
| KR | 10-2016-0126206 | 11/2016 | |
| TW | 201612287 | 4/2016 | |
| WO | WO-2023189512 A1 * | 10/2023 | C09G 1/02 |

OTHER PUBLICATIONS

Copending U.S. Appl. No. 18/409,601, filed Jan. 10, 2024.

(Continued)

*Primary Examiner* — Duy Vu N Deo

(74) *Attorney, Agent, or Firm* — Blake T. Biederman; Kerisha A. Bowen

(57) ABSTRACT

The invention provides a chemical mechanical polishing solution for metal and metal nitride substrates comprising: a solvent; at least one abrasive with a Mohs hardness of at least 8; and at least one soluble metal oxide anion wherein the metal is selected from vanadium, niobium, tantalum, chromium, molybdenum and tungsten.

10 Claims, 3 Drawing Sheets

(56) References Cited

U.S. PATENT DOCUMENTS

| | | | |
|---|---|---|---|
| 2021/0066086 A1 | 3/2021 | Kim et al. | |
| 2021/0071035 A1 | 3/2021 | Takai et al. | |
| 2021/0147712 A1 | 5/2021 | Moon et al. | |
| 2021/0147713 A1 | 5/2021 | Jung et al. | |
| 2021/0205958 A1 | 7/2021 | Sjoberg et al. | |
| 2022/0089908 A1* | 3/2022 | Reiss | H01L 21/31053 |
| 2022/0324712 A1 | 10/2022 | Takeuchi et al. | |

OTHER PUBLICATIONS

Copending U.S. Appl. No. 18/409,615, filed Jan. 10, 2024.
Copending U.S. Appl. No. 18/409,628, filed Jan. 10, 2024.
Copending U.S. Appl. No. 18/409,643, filed Jan. 10, 2024.

* cited by examiner

SOLUBLE METAL OXIDE ANION CMP SLURRY

FIELD OF THE INVENTION

The present invention relates to the field of chemical mechanical polishing. In particular, the present invention is directed to chemical mechanical polishing compositions for metal polishing.

BACKGROUND OF THE INVENTION

In the fabrication of integrated circuits and other electronic devices, multiple layers of conducting, semiconducting and dielectric materials are deposited onto and removed from a surface of a semiconductor wafer. Thin layers of conducting, semiconducting and dielectric materials may be deposited using a number of deposition techniques. Common deposition techniques in modern wafer processing include physical vapor deposition (PVD), also known as sputtering, chemical vapor deposition (CVD), plasma-enhanced chemical vapor deposition (PECVD) and electrochemical plating, among others.

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful for removing undesired surface topography and surface defects, such as rough surfaces, agglomerated materials, crystal lattice damage, scratches and contaminated layers or materials. Planarization is particularly critical in polishing metal layers adjacent non-metal layers in advanced semiconductor applications. Furthermore, control of metal dishing and dielectric erosion are increasingly important.

Chemical mechanical planarization, or chemical mechanical polishing (CMP), is a common technique used to planarize or polish work pieces such as semiconductor wafers. In conventional CMP, a wafer carrier, or polishing head, is mounted on a carrier assembly. The polishing head holds the wafer and positions the wafer in contact with a polishing layer of a polishing pad that is mounted on a table or platen within a CMP apparatus. The polishing slurry provides the correct balance of removal rate, selectivity, dishing and erosion to connect features of modern semiconductors.

Metals and metal nitrides, such as cobalt, copper, molybdenum, tungsten, titanium nitride and tantalum nitride are used in semiconductor manufacturing for the formation of metal lines and contact vias connecting inter layers of metal lines in integrated circuits. Most semiconductors use copper metal lines to connect semiconductor features, such as transistors. Titanium nitride and tantalum nitride can serve as barrier films that protect dielectric from copper diffusion. In the formation of via holes are etched through an interlevel dielectric (ILD) to interconnection lines or to a semiconductor substrate. A thin adhesion layer of, for example, titanium nitride or titanium may then be formed over the ILD and into the etched via hole. A cobalt, molybdenum or tungsten film is then blanket deposited over the adhesion layer and into the via. Excess cobalt, molybdenum or tungsten is then removed by chemical mechanical polishing to form the tungsten vias.

The chemical mechanical polishing composition used in the via polishing is an important variable in determining the success of the process. Depending on the choice of the abrasive and other additives, the chemical mechanical polishing composition can be tailored to provide effective polishing of various layers present at desired polishing rates while minimizing surface imperfections, defects, corrosion, and erosion of the interlevel dielectric adjacent to the tungsten vias. Furthermore, the chemical mechanical polishing composition may be used to provide controlled polishing selectivity to other materials present at the surface of the substrate being polished such as, for example, silicon oxide, titanium, titanium nitride, silicon nitride and the like.

Typically, tungsten polishing is accomplished using a chemical mechanical polishing composition that includes abrasive particles and a chemical reagent. Conventional polishing compositions for tungsten polishing use alumina ($Al_2O_3$) or silica ($SiO_2$) fine particles as an abrasive material with a Fenton's catalyst or reagent. Fenton's regents operate in a harsh oxidizing environment usually at an acidic pH well below 3.5. In many cases, however, the resulting compositions etch tungsten in a manner that chemically etches tungsten from the surface instead of converting the tungsten to a soft oxidized film that is more easily removed from the surface by mechanical abrasion. Due to this enhanced chemical action, such compositions tend to cause recessing of the tungsten plug. Recessed tungsten vias, where the surface of the tungsten in the via is below that of the surrounding interlayer dielectric material can cause electrical contact problems to other areas of the device. Moreover, the recessing in the center of the tungsten vias can lead to increased nonplanarity of the device on subsequent levels of the device. Etching of the tungsten from the center of the vias can also cause undesirable "keyholing".

Notwithstanding, there is a continuing need for new chemical mechanical polishing compositions for metal and metal nitride polishing for polishing and planarizing semiconductor wafers.

SUMMARY OF THE INVENTION

An aspect of the invention provides a chemical mechanical polishing solution for metal and metal nitride substrates comprising: a solvent; at least one abrasive with a Mohs hardness of at least 8; and at least one soluble metal oxide anion wherein the metal is selected from vanadium, niobium, tantalum, chromium, molybdenum and tungsten.

Another aspect of the invention provides a chemical mechanical polishing solution for metal and metal nitride substrates comprising: a solvent; functionalized carbon-based particles having oxygen-containing functional groups, the functionalized carbon-based particles having oxygen-containing functional groups react with a peroxy moiety to increase oxygen to carbon atomic ratio on the functionalized carbon-based particles, the functionalized carbon-based particles containing at least 10 weight percent of an sp3-containing structure, wherein the functionalized carbon-based particles include at least 0.01 atomic percent oxygen and wherein a surface of the functionalized carbon-based particles has an atomic oxygen to carbon ratio of at least 0.01; and at least one soluble metal oxide anion wherein the metal is selected from vanadium, niobium, tantalum, chromium, molybdenum and tungsten.

DETAILED DESCRIPTION OF THE INVENTION

Figure 1:
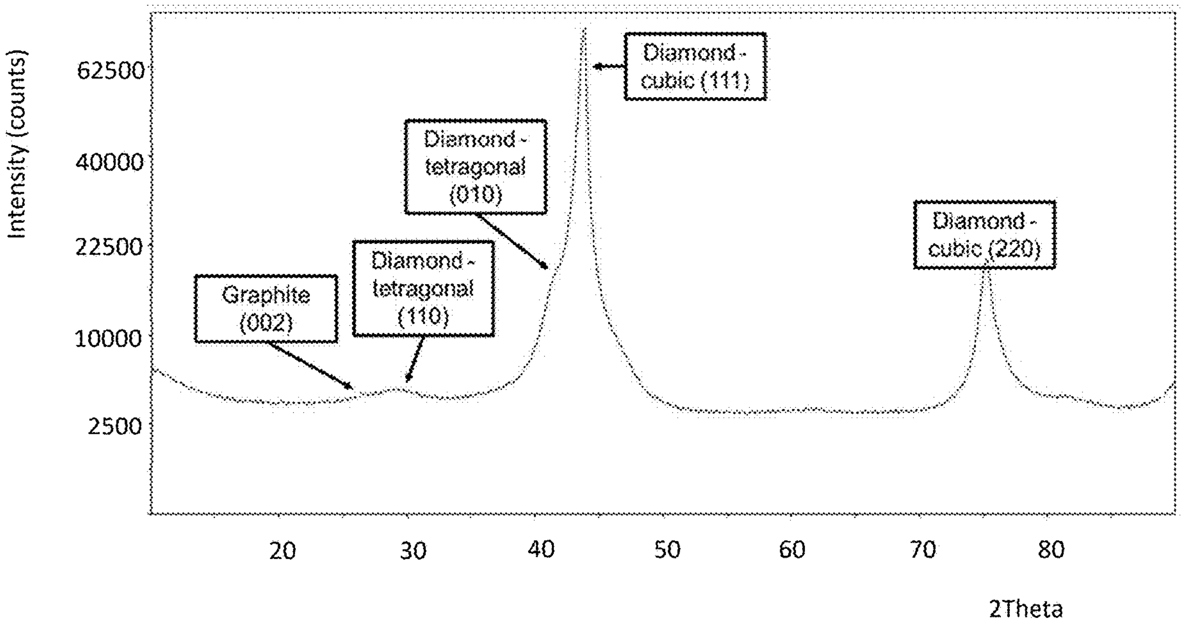
FIG. 1 provides the crystal structure of functionalized carbon-based particles 2-1 measured by x-ray diffraction.

The polishing slurries of invention are useful for polishing and planarizing metal and metal nitride-containing semiconductor substrates. In particular, the solutions are useful for cobalt, copper, molybdenum, tungsten, titanium nitride and tantalum nitride layers. The polishing formulation of the invention provides effective removal rates of soft metals, such as cobalt, copper and titanium, hard metals such as molybdenum and tungsten and metal nitrides, such as titanium nitride and tantalum nitride. Furthermore, it can provide effective selectivity with respect to dielectric layers, such as TEOS and silicon nitride layers.

The slurry operates with functionalized carbon-based particles having oxygen-containing functional groups. Advantageously, the oxygen-containing functional group is a COOH and its salts, COOOH and its salts, OH—, ketone, oxirane or a combination thereof. Most advantageously, the functional group is COOH and its salts or COOOH and its salts. The functionalized carbon-based particles having oxygen-containing functional groups react with a peroxy moiety to increase oxygen on the carbon-based particles. For example, the COOH and its salts groups can react with peroxy moieties to form COOOH— groups. Optionally, the carbon-based particles may also include an amine ($NH_2$) group, hydroxyl (OH) group, sulfonate ($SO_3$) group or hydrocarbon (C—H) groups.

The carbon-based particles contain sp3-containing structure for effective removal rate of metal and metal nitrides. Non-sp3 carbon structures, such as pure graphite, graphene and amorphous carbon do not provide effective removal rate of metal and metal nitrides. For example, the carbon particles contain at least 10 weight percent of an sp3-containing structure. Advantageously, the carbon particles contain at least 30 weight percent of an sp3-containing structure. Most advantageously, the carbon particles contain at least 50 or even 60 weight percent of an sp3-containing structure. In the functionalized carbon-based particle includes at least 0.01 atomic percent oxygen. Advantageously, the functionalized carbon-based particle includes at least 0.02 atomic percent oxygen. Most advantageously, the functionalized carbon-based particle includes at least 0.025 atomic percent oxygen. In addition, the surface of the carbon-based particles has an atomic oxygen to carbon ratio of at least 0.01. Most advantageously, the surface of the carbon-based particles has an atomic oxygen to carbon ratio of at least 0.02. The oxygen associated with the carbon-based particles increases removal rate of the metal and metal nitride substrates. Similar oxygen compounds, in solution, such as peracetic acid provide no improvement to removal rate when without the use of the sp3-containing carbon particles. These polishing slurries can provide the advantage of operating without Fenton's catalyst or reagent. Thus, for some formulations, it is advantageous to operate with an iron-free formulation. These formulations can operate at higher pH levels with less hydrogen peroxide that can result in lower static etch rates.

Optionally, the polishing slurry contains a Fenton's catalyst or reagent. Examples of Fenton's catalysts or reagent include at least one transition metal catalyst selected from the group consisting of metal salts of Ag, Co, Cr, Cu, Fe, Mo, Mn, Nb, Ni, Os, Pd, Ru, Sn, Ti, and V, and mixtures thereof. Most advantageously, the Fenton's reagent is iron and examples of suitable iron-based catalysts include iron (III) sulfate, iron(III) nitrate, iron(III) chloride, iron(III) oxalate, potassium tris(oxalato)ferrate (III), ammonium hexacyanoferrate(III), potassium hexacyanoferrate(III), iron (III) citrate, ammonium iron(III) citrate. Typical amounts of Fenton's reagent are 1 to 5000 ppm and advantageously, 5 to 1000 ppm. When using Fenton's reagent, it is advantageous to use a stabilizer for the hydroxy free radical. Examples of stabilizers include the following: citric acid, lactic acid, malic acid, maleic acid, malonic acid, oxalic acid, tartaric acid, phytic acid, gluconic acid. Most advantageously, the stabilizer is malonic acid. Typical amounts for the stabilizer is 0.001 to 1 wt. %. Advantageously, the stabilizer is in an amount of 0.005 to 0.5 wt. %. For purposes of this patent application, all concentrations are express in weight percent, unless noted otherwise.

The carbon-based particles can have a cubic phase or sp3 core and a non-cubic carbon exterior surface. The cubic phase carbon core provides hard particles that contribute to polishing removal rate. In addition, the non-cubic carbon exterior surface, can reduce scratching that can originate from the diamond interior. For example, the surface of the carbon-based particles can include a graphene, graphite, amorphous carbon or a mixture thereof.

The carbon-based hybrid particles typically have an average diameter of 0.2 to 200 nm. Advantageously, the carbon-based hybrid particles have an average diameter of 0.5 to 100 nm. Most advantageously, the carbon-based hybrid particles have an average diameter of 0.1 to 50 nm. Unlike conventional colloidal silica particles, carbon-based hybrid particles can be effective with average diameters of 1 to 10 nm or even 0.5 to 5 nm as measured with scanning electron microscopy. In addition, the carbon-based hybrid particles are effective with concentrations of 1 ppm to 10 wt %. Advantageously, the carbon-based hybrid particles are present in an amount of 1 ppm to 500 ppm. Most advantageously, the carbon-based hybrid particles are present in an amount of 2 ppm to 200 ppm.

The functionalized carbon-based abrasive operates with peroxy moieties. These peroxy moieties can be inorganic or organic per-compound. For purposes of this application, peroxy moieties is a compound including one or more peroxy groups (—O—O—). As the examples of the compound including one or more peroxy groups, although not limited hereto, hydrogen peroxide and adducts thereof, for example, urea hydrogen peroxide, percarbonate, benzyl peroxide, peracetic acid, di-t-butyl peroxide, monopersulfate ($SO_5^{2-}$)-based compounds, disulfate ($S_2O_8^{2-}$)-based compounds, sodium peroxide, peroxyformic acid, propaneperoxoic acid; substituted or unsubstituted butaneperoxoic acid; hydroperoxy-acetaldehyde and mixtures thereof. Most advantageously, the oxidizer is hydrogen peroxide. With hydrogen peroxide, the end user can typically add the hydrogen peroxide at point of use by mixing it into a holding tank prior to usage.

Optionally, the slurry includes an inhibitor for the metal or the metal nitride. Inhibitors are especially important when polishing cobalt, copper, molybdenum and tungsten. Examples of cobalt inhibitors include heterocyclic nitrogen compound that is selected from the group consisting of benzotriazole, adenine, 1,2,4-triazole, imidazole, polyimidazole and mixtures thereof. Examples of copper inhibitors include an azole inhibitor, wherein the azole inhibitor is selected from the group consisting of benzotriazole, mercaptobenzotriazole, tolytriazole, imidazole and combinations thereof. Examples of molybdenum inhibitors include amino acids, nitrogen-containing heterocyclic compounds such as pyridine, pyrazine, piperidine, pyridazine, pyrimidine, benzotriazole, benzothiazole, triazole, indole, or zwitterionic surfactants. Inhibitors are typically present in an amount of 0.005 to 2 wt. %. Most advantageously, inhibitors are typically present in an amount of 0.01 to 1 wt. %.

When polishing tungsten, cationic inhibitors operate best for controlling static etch. Typical inhibitors include amines, such as primary, secondary, tertiary and quaternary amines. Examples of these amines include amino acids such as arginine, histidine, proline, lysine, glycine, tryptophan, alanine, cysteine. Advantageously, the tungsten inhibitor is a cationic nitrogen-containing polymer or copolymer containing primary, secondary, tertiary and quaternary amines, a cationic polyvinyl alcohol, a cationic cellulose, and combinations thereof. Examples of cationic nitrogen-containing polymers or copolymers include polyallylamine, poly(4-aminostyrene) polyethylenimine, poly(N-methylvinylamine), chitosan, poly(vinyl-1-methylpyridinium) halides, polylysine, poly(vinylimidazolium), poly(methacryloyloxyethyltrimethylammonium) halides, poly(methacryloyloxyethyl-trimethylammonium) halides, poly(diallyldimethylammonium) halides and polyquaternium compounds. Nitrogen-containing polymeric inhibitors are typically present in an amount of 0.0001 to 1 wt. %. Most advantageously, nitrogen-containing polymeric inhibitors are typically present in an amount of 0.001 to 0.5 wt. %.

In addition to the carbon-based hybrid particles, the polishing composition described herein may contain a second abrasive. The abrasive is typically a metal oxide abrasive preferably selected from the group consisting of silica, alumina, titania, zirconia, germania, ceria and mixtures thereof. Advantageously, the secondary abrasive is silica. Adding a mixture of silica abrasive, Fenton's catalyst or reagent in combination with a corrosion inhibitor can further increase metal removal rates. The silica can be a fumed silica or a colloidal silica. When adding silica, typically it has a concentration of 0.01 wt % to 5 wt %. Most advantageously, the silica has a concentration of 0.1 to 2 wt. %. Typical average diameters of silica is 10 to 200 nm and 20 to 100 nm for colloidal silica. Alternatively, the carbon-based hybrid particles can be added in amounts from 1 to 1000 ppm to further increase metal removal rates of Fenton's reagent-containing slurries. Most advantageously, these particles are added in an amount of 1 to 100 ppm.

For Fenton-free solutions, the solutions typically contain less than 0.01 μM hydroxyl radical as measured with the 1 wt % hydrogen peroxide conditions of Example 17. Advantageously, Fenton-free solutions contain less than 0.005 μM hydroxyl radical when measured with the 1 wt % hydrogen peroxide conditions of Example. Most advantageously, the test does not detect the presence of hydroxyl radical when measured with the 1 wt % hydrogen peroxide conditions of Example. Similarly, for the solutions containing molybdic acid, they typically contain less than 0.1 μM hydroxyl radical as measured with the 1 wt % hydrogen peroxide conditions of Example 17. Advantageously, molybdic acid-containing solutions advantageously include less than 0.05 μM hydroxyl radical. When the solution contains Fenton catalyst-containing ions, it contains at least 0.5 μM hydroxyl radical when measured with the 1 wt % hydrogen peroxide conditions of Example 17. Advantageously, the Fenton-containing solution contains at least 1 μM hydroxyl radical when measured with the 1 wt % hydrogen peroxide conditions of Example 17.

Optionally, the slurry includes at least one soluble metal oxide anion wherein the metal is selected from vanadium, niobium, tantalum, chromium, molybdenum and tungsten. The metal oxide anions are soluble in the solvent of the CMP slurry, such as aqueous solvents. Advantageously, the metal oxide anions are soluble in deionized water. Examples of suitable metal oxide anions include molybdic acid, silicomolybdic acid and phosphomolybdic acid. Most advantageously, the metal oxide anion is molybdic acid. The structure of these metal oxide anions is advantageously $[M_xO_y]^-{}_n$. where x and y are 1 or greater than 1 and n is at least 1. The metal oxide anions are typically present in an amount from 100 ppm to 1 wt %. In addition to the carbon-based hybrid particles, these formulation will operate with any particles having a hardness of at least 8. For example, alumina, diamond, silicon carbide and boron nitride particles will work. Most advantageously, the slurry uses the carbon-based hybrid particles. Typically, these slurries include 50 ppm to 1000 ppm abrasive particles having a harness of at least 8. The hardness of at least 8 is important for providing mechanical abrasion against tungsten metal-tungsten metal also has a similar Mohs hardness.

One potential disadvantage of the functional carbon-based particles is that they are not stable in acidic solutions with a pH of about 4 or less. Furthermore, functional carbon-based particles are only stable at a pH from 4 to 4.5 in the presence of molybdic acid. It has been discovered that an oligomer or polymer having at least 50 mol % $R_1$—C(O)—N[—$R_2$, —$R_3$] units wherein $R_1$, $R_2$, —$R_3$ are selected from at least one of H, saturated or unsaturated aromatic or aliphatic groups, aryl, cycloaliphatic hydrocarbon or a mixture thereof can stabilize the carbon-based hybrid particles. In particular, these oligomers or polymers stabilize the carbon-based particles at all acidic pH levels. Furthermore, these oligomers or polymers can stabilize carbon-based particles in the presence of molybdic acid at all acidic pH levels. In addition to stabilizing the carbon-based hybrid particles, these oligomers or polymer coordinate with tungsten and when coupled with a cationic species provide effective inhibition of tungsten static etch. Specific examples of the oligomer or polymers for stabilizing the slurry are as follows: salicylhydroxamic acid, poly(N-isopropylacrylamide), polyacrylamide, poly(2-ethyl-2-oxazoline), polyvinylpyrrolidone. Alternatively, these polymers can be copolymers or block copolymers. Examples of suitable copolymers are as follows: polyquaternium-16 and polyquaternium-44 compounds, poly(acrylamide-co-diallyldimethylammonium chloride), poly(acrylamide-co-acrylic acid) wherein $R_1$—C(O)—N[—$R_2$, —$R_3$] unit is greater than 50 mol %. Advantageously, these represent polymers having a number average molecular weight of 200 to 2,000,000. Most advantageously, these represent polymers having a number average molecular weight of 500 to 1,000,000. Typically, the oligomer or polymer is present in an amount of 1 ppm to 10,000 ppm. Advantageously, the oligomer or polymer is present in an amount of 10 ppm to 1,000 ppm.

The polishing slurry works in a solvent, such as an aqueous or organic solvent or a mixture of aqueous and organic solvents. Typically, the solvent is an aqueous solvent. Advantageously, the aqueous solvent is deionized water. The polishing solution advantageously includes a balance of deionized water. For some applications, however, it is advantageous to include up to 10 wt. % alcohol solvent in the formulation. Furthermore, the solvent optionally includes a polar protic solvent or a combination of polar protic solvents such as methanol and ethanol (in any desirable ratio) such as 100%, 90%:10%, 80%:20%, 70%:30% and 60%:40%.

Optionally, the slurry includes a metal chelating/complexing agent that may prevent the undesired redeposition of insoluble metal oxide species, or accelerate the metal removal, wherein the complexing agent is selected from the group consisting of citric acid, lactic acid, malic acid, maleic acid, malonic acid, oxalic acid, tartaric acid, phytic acid, gluconic acid, L-aspartic acid, nitrilotriacetic acid, nitrilotri (methylphosphonic acid), ethylenediamine-N,N'-disuccinic acid trisodium salt, and ethylene glycol-bis (2aminoethylether)-N,N,N',N'-tetraacetic acid.

The polishing composition can also optionally include buffering agents such as various organic and inorganic bases or their salts with a pKa in the pH range of greater than 1 to 6. The polishing composition can further optionally include defoaming agents, such as non-ionic surfactants including esters, ethylene oxides, alcohols, ethoxylate, silicon compounds, fluorine compounds, ethers, glycosides and their derivatives, and the like. The defoaming agent can also be an amphoteric surfactant. The polishing composition may optionally contain biocides, such as Kordex™ MLX (9.5-9.9% methyl-4-isothiazolin-3-one, 89.1-89.5% water and 1.0% related reaction product) or Kathan™ ICP III containing active ingredients of 2-methyl-4-isothiazolin-3-one and 5-chloro-2-methyl-4-isothiazolin-3-one, each manufactured by The Dow Chemical Company, (Kathan and Kordex are trademarks of The Dow Chemical Company).

Preferably, the slurry polishes a semiconductor substrate by applying the slurry to a semiconductor substrate by placing 27.6 kPa or less downward force on a polishing pad. The downward force represents the force of the polishing pad against the semiconductor substrate. The polishing pad may have a circular shape, a belt shape or a web configuration. This low downward force is particularly useful for planarizing the semiconductor substrate to remove a barrier material from the semiconductor substrate. Most preferably, the polishing occurs with a downward force of less than or equal to 13.8 kPa.

EXAMPLES

Example 1

Polishing conditions: UMT Tribolab polisher, 9 in. (22.9 cm) diameter IC1010 concentric circular grooves polyurethane polishing pad manufactured by DuPont, Slurry flow rate: 40 ml/min, 3 psi (20.7 kPa), 211 rpm platen speed, 207 rpm carrier speed, 2.6×2.6 cm squares tungsten blanket wafer with a 4.25 inch diameter Saesol AK-45 diamond conditioner (170 μm diamonds with a 315 μm spacing).

TABLE 1

| Slurry | Graphite A-1 (wt. %) | Amorphous carbon nanoparticle B-1 (wt. %) | Hybrid structured C particle 1-1 (wt. %) | Hybrid structured C particle 2-1 (wt. %) | Hybrid structured C particle 3-1 (wt. %) | Hybrid structured C particle 4-1 (wt. %) | $H_2O_2$ (wt. %) | pH | pH Titrant |
|---|---|---|---|---|---|---|---|---|---|
| Comparative Example A | 0.02 | | | | | | 2 | 2.5 | $HNO_3$ |
| Comparative Example B | | 0.01 | | | | | 1 | 2.5 | $HNO_3$ |
| Example 1 | | | 0.01 | | | | 1 | 2.5 | $HNO_3$ |
| Example 2 | | | | 0.01 | | | 1 | 2.5 | $HNO_3$ |
| Example 3 | | | | | 0.01 | | 1 | 2.5 | $HNO_3$ |
| Example 4 | | | | | | 0.01 | 1 | 2.5 | $HNO_3$ |

Note:
Particle 2-1 had an average particle diameter of 125 μm.

TABLE 1-1

| Slurry | Particle | W Removal Rate (Å/min) | Carbon cubic phase (111) from XRD (Wt %) | Graphite phase from XRD (Wt %) | Amorphous phase from XRD (Wt %) | O/C atomic ratio from XPS | Estimated sp2 (Graphite)/ sp3 (Cubic) weight ratio from Raman |
|---|---|---|---|---|---|---|---|
| Comparative Example A | Graphite A-1 | 104 | 0 | 85 | 8 | 0.02 | No sp3 peak |
| Comparative Example B | Amorphous carbon B-1 | 94 | 0 | 13 | 87 | 0.06 | No sp3 peak |
| Example 1 | Hybrid 1-1 | 1195 | 94.0 | 0 | 2 | 0.075 | ~0.1 |
| Example 2 | Hybrid 2-1 | 1341 | 63.0 | 5 | 16 | 0.100 | ~0.1 |
| Example 3 | Hybrid 3-1 | 1011 | 99.0 | 0 | 1 | 0.095 | <0.01 |
| Example 4 | Hybrid 4-1 | 1058 | 99.0 | 0 | 1 | 0.087 | <0.01 |

The pure graphite and amorphous C nano particles examples did not provide significant tungsten polishing removal rates. The hybrid cubic carbon nanoparticles with oxygen-containing surfaces (O/C ratio>0.06 per XPS) increased tungsten removal rates.

FIG. 1 provides XRD peaks for hybrid particle of particle 2-1 measured with conditions as follows:

Instrument: Panalytical Empyrean Powder Diffractometer

Mode: reflection

Radiation: Cu K-alpha 1.54 Å

Optic: BBHD with ⅛° divergence slit, 20 mm mask

Detector: Pixel 1D line detector, with ⅛° slit, PHD 35/75, 0.04° soller slits, 3.347° window of measurement, Ni filter Sample Prep: Powders were transferred to a low-back, round stainless steel deep well holders and immediately placed in the instrument for measurements. Quantitative phase ID was performed by measuring corundum standard (external K-factor)

Scan time: 2 hr

Scan start, stop, and step size: 10°, 90°, 0.1°

Data analysis: Rietveld refinements were performed in Panalytical HighScore Plus 4.5 using corundum standard as an intensity reference. Crystallite size for cubic carbon phase was determined using line profile analysis with silicon powder as a line broadening standard.

The FIG. 1 data indicate that the particles include cubic, tetragonal, and graphite phases.

Figure 2:
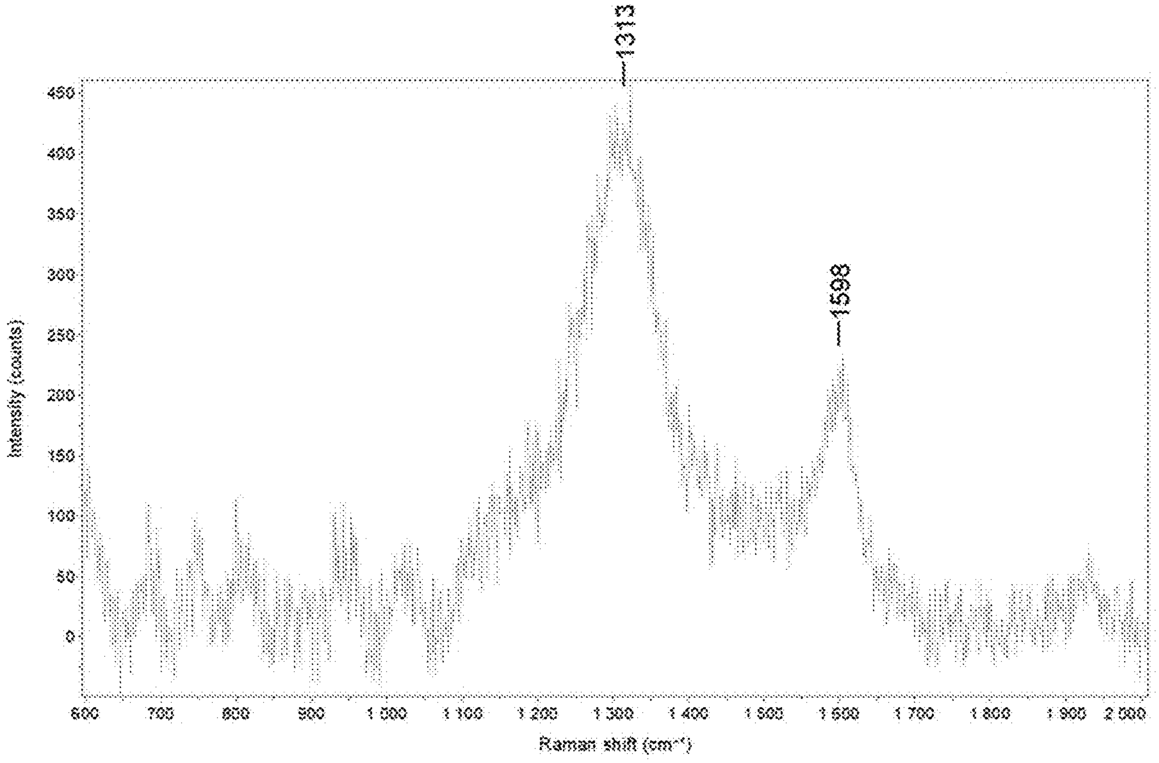
FIG. 2 provides Raman spectroscopy data for functionalized carbon-based particles 2-1.

The Raman measurements of FIG. 2 were measured using the following conditions:

Horiba LabRam HR Raman microscope using 785 nm excitation. A 10× objective (Olympus NA 0.4) was used in the measurements. The Duoscan rastering option available in this instrument was used to sample each spectrum over a 50×50 um region. The spectra reported here are the result of averaging the response from at least 3 separate areas. Power was kept very low (ca. 200-400 mW) to avoid changing the sample during the measurements.

Model: LabRam HR Raman microscope

Spot size: 50×50 um

Excitation wavelength: 785 nm

Power: ca. 300 mW

Integration time: 20 sec

Referring to FIG. 2, the Raman peak at 1313 cm−1 was consistent with cubic phase carbon. In addition, the Raman peak at 1598 cm−1 was consistent with a graphite peak.

Figure 3:
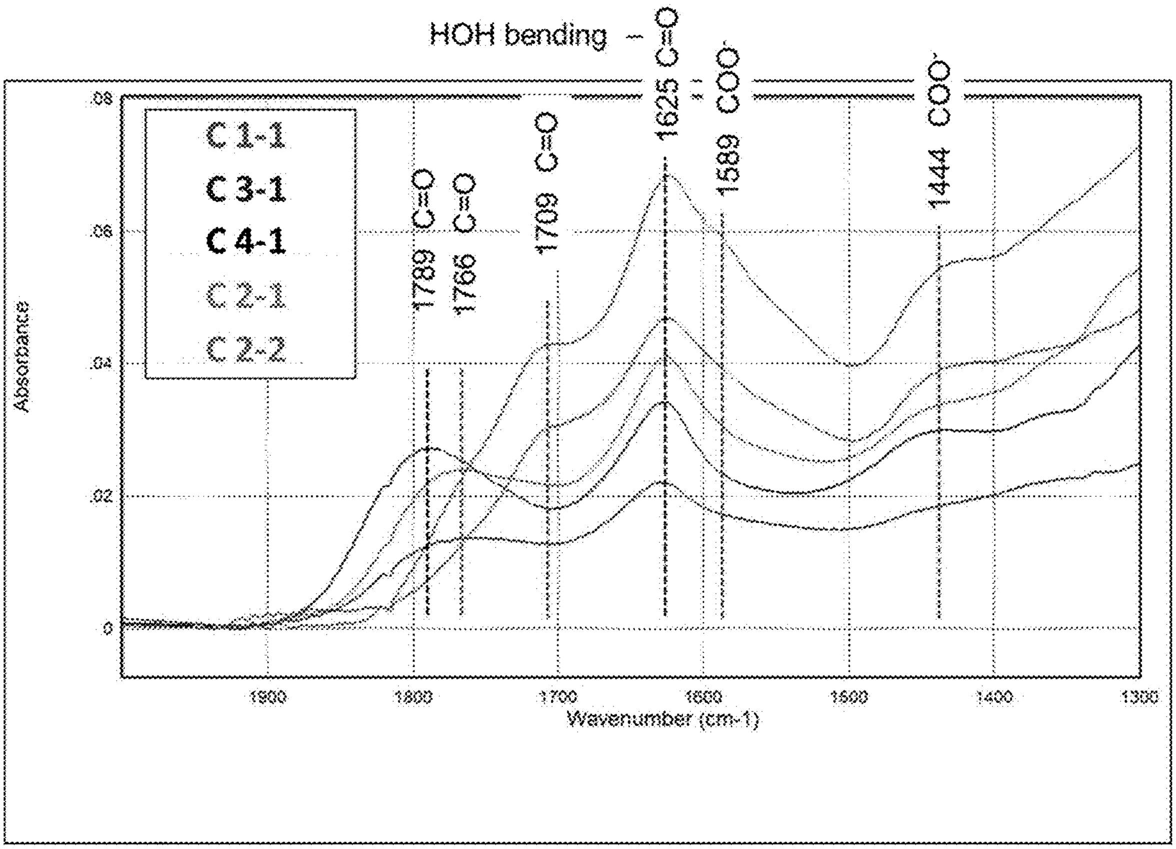
FIG. 3 provides the FTIR spectra for the surface of multiple functionalized carbon-based particles.

The FIG. 3 data were measured using a Diamond ATR-IR (DATR) with an integrated diamond crystal FTIR accessory that is part of a Thermo iS-50 FTIR spectrometer. Spectra were scaled to absolute intensity to provide the ability to compare response at least on a semi-quantitative basis. These FTIR spectra illustrates that the hybrid carbon particle surfaces were functionalized with both —COOH. Furthermore, the polishing data of Table 1-1 show that the functionalized carbon particles with cubic cores provided the highest tungsten polishing rates.

Example 2

A series of wafers were compared using 2.6 cm×2.6 cm square molybdenum wafers and the polishing conditions of Example 1. Table 2 below provides formulations at both acidic and alkaline pH levels.

TABLE 2

| Slurry | Colloidal silica | Ceria | Alumina | SiC | Hybrid structured C particle 2-1 (wt. %) | $H_2O_2$ | pH | pH Titrant |
|---|---|---|---|---|---|---|---|---|
| Comparative Example C | 0.5 | | | | | 1 | 3.5 | $HNO_3$ |
| Comparative Example D | | 0.5 | | | | 1 | 3.5 | $HNO_3$ |
| Comparative Example E | | | 0.5 | | | 1 | 3.5 | $HNO_3$ |
| Comparative Example F | | | | 0.5 | | 1 | 3.5 | $HNO_3$ |
| Comparative Example G | | | 0.5 | | | 1 | 10.7 | KOH |
| Comparative Example H | | | | 0.5 | | 1 | 10.7 | KOH |
| Example 5 | | | | | 0.0225 | 1 | 3.5 | $HNO_3$ |
| Example 6 | | | | | 0.0225 | 1 | 10.7 | KOH |

Table 2.1 below provides the molybdenum removal rates for the polishing slurries of Table 2.

TABLE 2.1

| Slurry | Mo Removal Rate (Å/min) - Type 2-1 |
|---|---|
| Comparative Example C | 159 |
| Comparative Example D | 1203 |
| Comparative Example E | 2328 |
| Comparative Example F | 863 |
| Comparative Example G | 1121 |
| Comparative Example H | 729 |
| Example 5 | 3134 |
| Example 6 | 1621 |

Tables 2 and 2.1 combine to show that hybrid structured C particle 2-1 with less than one tenth of the particle concentration outperformed silica, ceria, alumina and silicon carbide abrasive particles at acidic pH levels. At alkaline pH levels, the Mo RR is overall lower, but Hybrid structured C particle 2-1 still exhibited much better polishing efficiency than the alumina and silicon carbide abrasive particles.

Example 3

A series of wafers were compared using 2.6 cm×2.6 cm square molybdenum and TEOS wafers and the polishing conditions of Example 1. Table 3 below provides formulations at multiple abrasive concentrations, hydrogen peroxide concentrations and acidic pH levels.

TABLE 3

| Slurry | Colloidal silica (wt. %) | Iron(III) Nitrate (wt. %) | Titania (wt. %) | Zirconia (wt. %) | Hybrid structured C particle 2-1 (wt. %) | $H_2O_2$ (wt. %) | pH | pH Titrant |
|---|---|---|---|---|---|---|---|---|
| Comparative Example I | 0.5 | 0.02 | | | | 3 | 2.5 | $HNO_3$ |
| Comparative Example J | | | 0.5 | | | 1 | 3.5 | $HNO_3$ |
| Comparative Example K | | | | 0.5 | | 1 | 3.5 | $HNO_3$ |
| Example 7 | | | | | 0.0225 | 1 | 2.5 | $HNO_3$ |
| Example 8 | | | | | 0.0225 | 1 | 3.5 | $HNO_3$ |
| Example 9 | | | | | 0.0225 | 1 | 4.5 | $HNO_3$ |
| Example 10 | | 0.005 | | | 0.0225 | 1 | 2.5 | $HNO_3$ |
| Example 11 | | 0.02 | | | 0.0225 | 1 | 2.5 | $HNO_3$ |
| Example 12 | | | | | 0.01 | 1 | 2.5 | $HNO_3$ |
| Example 13 | | | | | 0.045 | 1 | 2.5 | $HNO_3$ |
| Example 14 | | | | | 0.0225 | 2 | 2.5 | $HNO_3$ |

Table 3.1 below provides the molybdenum and TEOS removal rates along with coefficients of friction for the polishing slurries of Table 3.

TABLE 3.1

| Slurry | Mo RR (Å/min) − Type 2 | TEOS RR (Å/min) | Mo CoF | TEOS CoF |
|---|---|---|---|---|
| Comparative Example I | 1060 | 66 | 0.34 | 0.21 |
| Comparative Example J | 554 | 21 | 0.21 | 0.10 |
| Comparative Example K | 698 | 262 | 0.40 | 0.11 |
| Example 7 | 1508 | 30 | 0.18 | 0.18 |
| Example 8 | 1437 | 22 | 0.21 | 0.14 |
| Example 9 | 1413 | 17 | 0.18 | 0.12 |
| Example 10 | 2127 | 47 | 0.23 | 0.18 |
| Example 11 | 2203 | 40 | 0.27 | 0.15 |
| Example 12 | 1379 | 30 | 0.16 | 0.15 |
| Example 13 | 1629 | 54 | 0.21 | 0.19 |
| Example 14 | 1704 | 39 | 0.15 | 0.18 |

CoF = Coefficient of Friction;
RR = Removal Rate;
TEOS = the oxidized product of tetraethyl orthosilicate In comparison to titania and zirconia, hybrid structured C particle 2-1 exhibited much higher molybdenum removal rates while maintaining lower TEOS removal rates. Thus, the slurry provides an increased enhanced Mo/TEOS removal selectivity. Furthermore, despite a higher molybdenum removal rate, the hybrid structured hybrid particle 2-1 also showed a lower coefficient of friction. The molybdenum removal rates achieved with hybrid structured hybrid particle 2-1 were higher at a pH range of 2.5 to 4.5 and abrasive wt % effect without using Fenton chemistry in comparison to a silica particle formulation using an iron-containing Fenton reagent chemistry.

Example 4

A series of wafers were compared using 2.6 cm×2.6 cm square molybdenum wafers and the polishing conditions of Example 1. Table 4 below provides multiple hybrid particle formulations at an acidic 2.5 pH level.

TABLE 4

| Slurry | Graphite A-1 (wt. %) | Hybrid structured C particle 1-1 (wt. %) | Hybrid structured C particle 2-1 (wt. %) | Hybrid structured C particle 3-1 (wt. %) | Hybrid structured C particle 4-1 (wt. %) | $H_2O_2$ | pH | pH Titrant |
|---|---|---|---|---|---|---|---|---|
| Comparative Example L | 0.02 | | | | | 2 | 2.5 | $HNO_3$ |
| Example 15 | | | | 0.01 | | 1 | 2.5 | $HNO_3$ |
| Example 16 | | | | | 0.01 | 1 | 2.5 | $HNO_3$ |
| Example 17 | | 0.01 | | | | 1 | 2.5 | $HNO_3$ |
| Example 18 | | | 0.01 | | | 1 | 2.5 | $HNO_3$ |

Table 4.1 below provides the molybdenum removal rates along with coefficients of friction for the polishing slurries of Table 4.

TABLE 4.1

| Slurry | Mo RR (Å/min) | Mo CoF | Cubic (111) Percentage (wt. %) |
|---|---|---|---|
| Comparative Example L | 359 | 0.10 | <0.1 |
| Example 15 | 1694 | 0.24 | 99 |
| Example 16 | 1353 | 0.14 | 99 |
| Example 17 | 1844 | 0.24 | 94 |
| Example 18 | 1558 | 0.15 | 63 |

CoF = Coefficient of Friction;
RR = Removal Rate

Among the types of hybrid carbon nanoparticles, the slurries with percentage of cubic structure (111) from XRD ranging from 63 to 99 provided significant molybdenum removal rate enhancement. Examples 16 and 18 provided excellent removal rates with low coefficient of friction values.

Example 5

A series of wafers were compared using 2.6 cm×2.6 cm square cobalt and TEOS (silicon dioxide) wafers and the polishing conditions of Example 1. Table 5 below provides formulations at 2.75.

TABLE 5

| Slurry | Hybrid structured C particle 2-2 (wt. %) | Peracetic acid (wt. %) | Graphite A-1 (wt. %) | Colloidal Silica (wt. %) | $H_2O_2$ (wt. %) | pH | pH Titrant |
|---|---|---|---|---|---|---|---|
| Comparative Example M | | 0.01 | | | 3 | 2.75 | HNO3 |
| Example 19 | 0.01 | | | | 3 | 2.75 | HNO3 |
| Comparative Example N | | 0.01 | 0.02 | | | 2.75 | HNO3 |
| Comparative Example O | | 0.01 | 0.02 | | 3 | 2.75 | HNO3 |
| Example 20 | 0.01 | | 0.02 | | 3 | 2.75 | HNO3 |
| Comparative Example P | | 0.01 | | 0.2 | | 2.75 | HNO3 |
| Comparative Example Q | | 0.01 | | 0.2 | 3 | 2.75 | HNO3 |
| Example 21 | 0.01 | | | 0.2 | 3 | 2.75 | HNO3 |

Note:
Particle 2-2 had an average diameter of 50 nm.

TABLE 5-1

| Slurry | W RR (Å/min) | TEOS RR (Å/min) |
|---|---|---|
| Comparative Example M | 72 | 2 |
| Example 19 | 1281 | 29 |
| Comparative Example N | 9 | 6 |
| Comparative Example O | 97 | 7 |
| Example 20 | 1126 | 30 |
| Comparative Example P | 65 | 131 |
| Comparative Example Q | 165 | 144 |
| Example 21 | 1018 | 19 |

RR = Removal Rate; TEOS = the oxidized product of tetraethyl orthosilicate

Table 5-1 illustrates that the peracetic acid-containing polishing solutions do not increase in tungsten removal rate. The hybrid carbon particles, however, containing COOH functional groups provide a significant increase in tungsten removal rate. Since the peracetic acid in solution includes a peroxy moiety, this illustrates that COOH functional groups must be attached to hybrid carbon particles and be activated by hydrogen peroxide for effective tungsten removal.

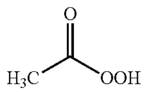

Example 6

In this Example, 100 ppm hybrid C particles 2.2 were mixed with increasing amounts of hydrogen peroxide. Table 6 below provides the hydrogen peroxide concentration and the resulting O/C atomic ratio as measured with EDS (energy dispersive x-ray spectroscopy) from a scanning transmission electron microscope (STEM).

TABLE 6

| Sample | O/C Atomic Ratio |
|---|---|
| 0.1 wt % $H_2O_2$ | 0.006 ± 0.002 |
| 0.25 wt % $H_2O_2$ | 0.009 ± 0.003 |
| 0.5 wt % $H_2O_2$ | 0.010 ± 0.006 |
| 1 wt % $H_2O_2$ | 0.015 ± 0.011 |
| 2 wt % $H_2O_2$ | 0.053 ± 0.037 |

These data illustrate that oxygen concentration on the surface of the hybrid C particles increases with concentration of hydrogen peroxide.

Example 7

A series of wafers were compared using 2.6 cm×2.6 cm square copper and tantalum nitride wafers and the polishing conditions of Example 1. Table 7 below provides formulations at pH 6.8 and 2.5.

TABLE 7

| Slurry | Silica (wt. %) | Hybrid structured C particle 2-1 (wt. %) | Iminodiacetic acid (wt. %) | BTA (wt. %) | Molybdic acid (wt. %) | $H_2O_2$ (wt. %) | pH | pH Titrant |
|---|---|---|---|---|---|---|---|---|
| Commercial slurry R | 1 | | | | | 1 | 6.8 | $HNO_3/NH_4OH$ |
| Example 22 | | 0.01 | 0.6 | | | 1 | 6.8 | $HNO_3/NH_4OH$ |
| Example 23 | | 0.01 | 0.6 | 0.0025 | | 1 | 6.8 | $HNO_3/NH_4OH$ |
| Example 24 | | 0.01 | 0.6 | 0.01 | | 1 | 6.8 | $HNO_3/NH_4OH$ |
| Example 25 | | 0.005 | | | 0.2 | 2 | 2.5 | $HNO_3/NH_4OH$ |
| Example 26 | | 0.005 | | | 0.2 | 2 | 2.2 | $HNO_3/NH_4OH$ |

Table 7.1 below provides the copper and tantalum nitride removal rates for the polishing slurries of Table 7.

TABLE 7

1

| Slurry | Cu RR (Å /min) | TaN RR (Å /min) |
|---|---|---|
| Commercial slurry R* | 3952 | 3 |
| Example 22 | 8165 | 135 |
| Example 23 | 4750 | 133 |
| Example 24 | 2316 | 132 |
| Example 25 | 10889 | |
| Example 26 | 15886 | |

*Commercial Slurry R was a bulk copper slurry;
RR = Removal Rate

In comparison to commercial R, the examples showed that using hybrid structured carbon particle 2-1 abrasive with appropriate BTA level, achieved comparable or higher copper removal rates and much higher TaN removal rates.

Example 8

A series of wafers were compared using 200 mm wafers using Applied Materials' Mirra polishing tool with 93 rpm platen speed; 87 rpm carrier speed; 125 ml/minute slurry flow with a downforce of 3 psi (20.7 kPa) using an IK4250EH polishing pad. Table 8 below provides formulations at a pH of 2.5 with and without molybdic acid, iron nitrate or colloidal silica.

TABLE 8

| Slurry | Hybrid structured C particle 2-1 (wt. %) | Colloidal silica (wt. %) | Molybdic acid (wt. %) | $Fe(NO_3)_3$ (wt. %) | $H_2O_2$ (wt. %) | pH | pH Titrant |
|---|---|---|---|---|---|---|---|
| Comparative Example S | | 0.2 | | 0.2 | 3 | 2.5 | $HNO_3$ |
| Example 27 | 0.0025 | 0.2 | | 0.2 | 3 | 2.5 | $HNO_3$ |
| Example 28 | 0.01 | | 0.3 | | 3 | 2.5 | $HNO_3$ |
| Example 29 | 0.01 | | 0.3 | 0.2 | 3 | 2.5 | $HNO_3$ |

Table 8.1 below provides the tungsten, TEOS, silicon nitride, titanium nitride and titanium removal rates for the polishing slurries of Table 8.

TABLE 8.1

| Slurry | W RR (Å /min) | TEOS RR (Å /min) | SIN RR (Å /min) | TIN RR (Å /min) | TI RR (Å /min) |
|---|---|---|---|---|---|
| Comparative Example S | 2535 | 124 | 199 | 4326 | 1283 |
| Example 27 | 3802 | 42 | 120 | 6007 | 1279 |
| Example 28 | 1731 | 24 | 96 | 3201 | 1478 |
| Example 29 | 3572 | 23 | 104 | 4280 | 1431 |

RR = Removal Rate;
TEOS = the oxidized product of tetraethyl orthosilicate

Table 8 and 8.1 combine to illustrate that the hybrid carbon particles operate in a cumulative manner with ferric nitrate and colloidal silica to increase removal rate. Furthermore molybdic acid operates with the hybrid particles to further increase removal rate of tungsten, titanium nitride and titanium. Molybdic acid had little impact upon silicon nitride and TEOS removal rates.

Example 9

A series of wafers were compared using 2.6 cm×2.6 cm square cobalt and TEOS (silicon dioxide) wafers and the polishing conditions of Example 1. Table 9 below provides formulations at 2.5 and 8.

TABLE 9

| Slurry | Hybrid structured C particle 2-1 (wt. %) | Graphite A-1 (wt. %) | Hybrid structured C particle 3-1 (wt. %) | Silica (wt. %) | Aspartic acid (wt. %) | Molybdic acid (wt. %) | H2O2 (wt. %) | pH | pH Titrant |
|---|---|---|---|---|---|---|---|---|---|
| Comparative Example T | | | | 1 | 0.25 | | 0.4 | 8 | KOH |
| Comparative Example U | | 0.01 | | | 0.25 | | 0.4 | 8 | KOH |
| Example 30 | 0.01 | | | | 0.25 | | 0.4 | 8 | KOH |
| Example 31 | | | 0.01 | | 0.25 | | 0.4 | 8 | KOH |
| Example 32 | 0.01 | | | | | 0.3 | 3 | 2.5 | HNO3 |

Table 9.1 below provides the cobalt and TEOS removal rates for the polishing slurries of Table 9.

TABLE 9.1

| Slurry | Co RR (Å/min) | TEOS RR Å/min) |
|---|---|---|
| Comparative Example T | 1413 | 28 |
| Comparative Example U | 264 | 10 |
| Example 30 | 5854 | 26 |
| Example 31 | 6122 | 31 |
| Example 32 | 6129 | 111 |

RR = Removal Rate;
TEOS = the oxidized product of tetraethyl orthosilicate

The Tables demonstrate that the functionalized carbon-based particles provide a large increase in cobalt removal rate without significant impact on TEOS removal rate.

Example 10

Polishing conditions: AMAT Reflexion polisher, 30 in. (76.2 cm) diameter IKONIC™ 4121H concentric circular grooves polyurethane polishing pad manufactured by DuPont, Slurry flow rate: 250 ml/min, 1 psi (6.9 kPa), 115 rpm platen speed, 125 rpm carrier speed, 12-inch tungsten and TEOS blanket wafer with a 4.25 inch diameter Kinik I-PDA 33A-3 disk. Table 10 below provides 3 distinct formulations with and without dispersants. Metrology: SP2, defect >0.08 um.

TABLE 10

| Slurry | Hybrid structured C particle 2-3 (wt. %) | Poly(2-acrylamido-2-methyl-1-propanesulfonic acid) solution (wt. %) | Luviquat FC 370 (wt. %) | Molybdic acid (wt. %) | H2O2 (wt. %) | pH | pH Titrant |
|---|---|---|---|---|---|---|---|
| Comparative Example V | 0.005 | | | 0.3 | 3 | 3 | HNO3 |
| Example 33 | 0.005 | 0.02 | | 0.3 | 3 | 3 | HNO3 |
| Example 34 | 0.005 | | 0.01 | 0.3 | 3 | 3 | HNO3 |

Note:
Particle 2-3 had an average diameter of 5 nm.

Note: Luviquat FC370 is a polymeric quaternary ammonium salt formed from methylvinylimidazolium chloride and vinylpyrrolidone (3:7 molar ratio).

TABLE 10.1

| Slurry | W RR (Å /min) | TEOS RR (Å/min) | Total Defect Counts | Total chattermarks |
|---|---|---|---|---|
| Comparative Example V | 869 | 3 | 19434 | 17988 |
| Example 33 | 421 | 31 | 3631 | 2214 |
| Example 34 | 684 | 2 | 6625 | 5352 |

RR = Removal Rate;
TEOS = the oxidized product of tetraethyl orthosilicate

These data illustrate polymer dispersants decreasing chattermark defects for the hybrid carbon particles.

Example 11

A series of wafers were compared using 2.6 cm×2.6 cm square W, Mo and TEOS (silicon dioxide) wafers and the polishing conditions of Example 1. Table 11 below provides formulations at 2.5.

TABLE 11

| Material | Mohs' Hardness |
|---|---|
| Silica | 6-7 |
| Tungsten | 7.5-9 |
| Silicon Carbide | 9-10 |
| Diamond | 10 |

TABLE 11.1

| Slurry | Silica (wt. %) | Hybrid structured C particle 2-1 (wt. %) | Molybdic acid (wt. %) | Fe(NO3) (wt. %) | H2O2 (wt. %) | pH | pH Titrant |
|---|---|---|---|---|---|---|---|
| Comparative Example W | 0.2 | | | 0.02 | 3 | 2.5 | HNO3 |
| Comparative Example X | 0.2 | | 0.2 | | 3 | 2.5 | HNO3 |
| Comparative Example Y | 0.2 | | 0.1 | 0.02 | 3 | 2.5 | HNO3 |
| Comparative Example Z | | 0.0225 | | | 1 | 2.5 | HNO3 |
| Example 35 | | 0.0225 | 0.1 | | 1 | 2.5 | HNO3 |
| Example 36 | | 0.0225 | 0.2 | | 1 | 2.5 | HNO3 |

TABLE 11.2

| Slurry | W RR (Å/min) | Mo RR (Å /min) | TEOS RR (Å/min) |
|---|---|---|---|
| Comparative Example W | 1690 | 1136 | 71 |
| Comparative Example X | 272 | 497 | 49 |
| Comparative Example Y | 1450 | 1022 | 62 |
| Comparative Example Z | 971 | 1193 | 43 |
| Example 35 | 1522 | 1406 | 40 |
| Example 36 | 1959 | 2713 | 45 |

RR = Removal Rate;
TEOS = the oxidized product of tetraethyl orthosilicate

These data combine to show that molybdic acid in combination with silica abrasive particles does not increase tungsten removal rate. But molybdic acid was effective for increasing removal rate in combination with the hybrid carbon particles.

Example 12

A series of wafers were compared using 2.6 cm×2.6 cm square W, Mo and TEOS (silicon dioxide) wafers and the polishing conditions of Example 1. Table 12 below provides formulations at 2.5.

TABLE 12

| Slurry | Hybrid structured C particle 2-1 (wt. %) | SiC (wt. %) | Molybdic acid (wt. %) | Tungstic acid (wt. %) | Sodium orthovanadate (wt. %) | $H_2O_2$ (wt. %) | pH | pH Titrant |
|---|---|---|---|---|---|---|---|---|
| Comparative Example AA | 0.01 | | | | | 3 | 2.5 | HNO3 |
| Comparative Example AB | | 0.25 | | | | 3 | 2.5 | HNO3 |

TABLE 12-continued

| Slurry | Hybrid structured C particle 2-1 (wt. %) | SiC (wt. %) | Molybdic acid (wt. %) | Tungstic acid (wt. %) | Sodium orthovanadate (wt. %) | $H_2O_2$ (wt. %) | pH | pH Titrant |
|---|---|---|---|---|---|---|---|---|
| Example 37 | 0.01 | | 0.3 | | | 3 | 2.5 | HNO3 |
| Example 38 | 0.01 | | | 0.3 | | 3 | 2.5 | HNO3 |
| Example 39 | 0.01 | | | | 0.3 | 3 | 2.5 | HNO3 |
| Example 40 | | 0.05 | 0.3 | | | 3 | 2.5 | HNO3 |

TABLE 12.1

| Slurry | W RR (Å/min) | Mo RR (Å /min) | TEOS RR (Å/min) |
|---|---|---|---|
| Comparative Example AA | 854 | 1508 | 30 |
| Comparative Example AB | 209 | 363 | 264 |
| Example 37 | 3003 | 3720 | 37 |
| Example 38 | 1940 | 3606 | 37 |
| Example 39 | 2209 | 2555 | 67 |
| Example 40 | 726 | 911 | 94 |

RR = Removal Rate;
TEOS = the oxidized product of tetraethyl orthosilicate

These data illustrate that molybdic acid, tungstic acid and vanadate all increase tungsten and molybdenum removal rates with both hybrid carbon particles and SiC particles.

Example 13

A series of wafers were compared using 2.6 cm×2.6 cm square W, Mo and TEOS (silicon dioxide) wafers and the polishing conditions of Example 1. Table 13 below provides formulations at pH 2.5.

TABLE 13

| Slurry | Hybrid structured C particle 2-1 (wt. %) | Molybdic acid (wt. %) | Silicomolybdic acid solution (wt. %) | Phosphomolybdic acid hydrate (wt. %) | $H_2O_2$ (wt. %) | pH | pH Titrant |
|---|---|---|---|---|---|---|---|
| Comparative Example AC | 0.01 | | | | 3 | 2.5 | HNO3 |
| Example 41 | 0.01 | 0.3 | | | 3 | 2.5 | HNO3 |
| Example 42 | 0.01 | | 0.3 | | 3 | 2.5 | HNO3 |
| Example 43 | 0.01 | | 0.5 | | 3 | 2.5 | HNO3 |
| Example 44 | 0.01 | | | 0.3 | 3 | 2.5 | HNO3 |
| Example 45 | 0.01 | | | 0.5 | 3 | 2.5 | HNO3 |

TABLE 13.1

| Slurry | W RR (Å /min) | TEOS RR (Å /min) |
|---|---|---|
| Comparative Example AC | 877 | 18 |
| Example 41 | 2046 | 16 |
| Example 42 | 1763 | 22 |
| Example 43 | 2340 | 19 |
| Example 44 | 1165 | 12 |
| Example 45 | 1412 | 15 |

RR = Removal Rate;
TEOS = the oxidized product of tetraethyl orthosilicate

These data illustrate that molybdic acid and its derivatives all increase tungsten removal rate without increasing TEOS removal rate.

Example 14

This Example provides dispersant examples for hybrid carbon particles at pH 3 using nitric acid as the titrant.

TABLE 14

| Slurry | C 2-2 | Molybdic acid | Luviquat FC 370 | Poly(acrylamide-co-diallyldimethyl-ammonium chloride), acrylamide ~55% | Poly(acrylamide-co-acrylic acid) | Polyvinyl-pyrrolidone | Polyacrylamide | $H_2O_2$ |
|---|---|---|---|---|---|---|---|---|
| AC | 0.01 | | | | | | | |
| AD | 0.01 | 0.3 | | | | | | |
| AE | 0.01 | 0.3 | | | | | | 3 |
| 46 | 0.01 | | 0.001 | | | | | |
| 47 | 0.01 | | | 0.001 | | | | |
| 48 | 0.01 | | | | 0.001 | | | |
| 49 | 0.01 | | | | | 0.001 | | |
| 50 | 0.01 | | | | | | 0.001 | |

Note:
Luviquat FC370 is a polymeric quaternary ammonium salt formed from methylvinylimidazolium chloride and vinylpyrrolidone (3:7 molar ratio).

TABLE 14.1

| Slurry | Settling Rate LUMiSizer (%/s) | Normalized Settling Rate LUMiSizer |
|---|---|---|
| AC | 0.0056 | 1.0 |
| AD | 0.0059 | 1.1 |
| AE | 0.0839 | 15.0 |
| 46 | 0.0014 | 0.3 |
| 47 | 0.0034 | 0.6 |
| 48 | 0.0027 | 0.5 |
| 49 | 0.0032 | 0.6 |
| 50 | 0.0032 | 0.6 |

Note:
Normalizing was in comparison to comparative slurry AC and LUMiSizer was a dispersion analyzer from LUM GmbH to measure sedimentation, flotation or consolidation and the calculation of the velocity distribution in the centrifugal field.

These data illustrate that polymeric dispersants containing —C(═O)—NH-moiety are capable of reducing particle settling rates.

Example 15

Table 15 below provides formulations in weight percent for particle stability using 0.01 wt % hybrid structured carbon particle abrasive 2-2 containing 0.3 wt. % molybdic acid using nitric acid titrant.

TABLE 15-A

| Slurry | Polyethylen-imine | Poly(4-styrene-sulfonic acid) (Mw ~75000) | Poly (Propylene Glycol) (Mw ~100,000) | Luviquat FC 370 (Mw ~100,000), VP ~70% | Luviquat ® FC 550 (Mw ~80,000) VP ~50% | Poly (acrylamide-co-diallyldimeth-ylammonium chloride), acrylamide ~55% (Mw ~25,000) | Poly(2-ethyl-2-oxazoline) (Mw ~50000) | pH |
|---|---|---|---|---|---|---|---|---|
| AF | 0.001 | | | | | | | 3 |
| AG | | 0.001 | | | | | | 3 |
| AH | | | 0.001 | | | | | 3 |
| 51 | | | | 0.001 | | | | 3 |
| 52 | | | | 0.005 | | | | 2.5 |
| AI | | | | | 0.001 | | | 3 |
| 53 | | | | | | 0.001 | | 3 |
| 54 | | | | | | | 0.001 | 3 |

TABLE 15-B

| Slurry | Poly(acrylamide-co-acrylic acid) Mw ~520,000, acrylamide ~55% | Lidocaine | Polyvinylpyrrolidone (Mw ~10,000) | Polyacrylamide (Mw ~10,000) | Poly(diallyldimet-hylammonium chloride) (Mw ~8500) | Polyvinyl alcohol (Mw ~9k-10k) | pH |
|---|---|---|---|---|---|---|---|
| 55 | 0.001 | | | | | | 3 |
| 56 | | 0.001 | | | | | 3 |
| 57 | | | 0.001 | | | | 3 |

TABLE 15-B-continued

| Slurry | Poly(acrylamide-co-acrylic acid) Mw ~520,000, acrylamide ~55% | Lidocaine | Polyvinylpyrrolidone (Mw ~10,000) | Polyacrylamide (Mw ~10,000) | Poly(diallyldimethylammonium chloride) (Mw ~8500) | Polyvinyl alcohol (Mw ~9k-10k) | pH |
|---|---|---|---|---|---|---|---|
| 58 | | | | 0.001 | | | 3 |
| AJ | | | | | 0.001 | | 3 |
| AK | | | | | | 0.001 | 3 |

TABLE 15-1

| Slurry | 3 Hours | 1 day | 1 Week | 1 month |
|---|---|---|---|---|
| AF | Settled | | | |
| AG | | Settled | | |
| AH | | | Settled | |
| 51 | | | | Stable |
| 52 | | | | Stable |
| AI | | Settled | | |
| 53 | | | | Stable |
| 54 | | | | Stable |
| 55 | | | | Stable |
| 56 | | | | Stable |
| 57 | | | | Stable |
| 58 | | | | Stable |
| AJ | | Settled | | |
| AK | | | Settled | |

These data illustrate that polymeric dispersants containing —C(═O)—NH-moiety are capable of reducing particle settling rates.

Example 16

Table 16 below provides formulations for static etch control using 0.01 wt % hybrid structured carbon particle abrasive 2-2 and 0.3 wt % molybdic acid (except AL) at pH 3 using nitric acid titrant.

Experimentally, a series of 2.6 cm×2.6 cm square tungsten wafers were submerged into slurries for 3 minutes under 55° C. Static etching rates (Å/min) were calculated by (post-etching wafer thickness−pre-etching wafer thickness)/3.

TABLE 16

| Slurry | Polyethylenimine | Poly(4-styrenesulfonic acid) | Poly (Propylene Glycol) | Luviquat FC 370 | Poly(diallyldimethylammonium chloride) | Poly(acrylamide-co-diallyldimethylammonium chloride), acrylamide ~55% | Poly(acrylamide-co-acrylicacid), partial sodium salt | Poly(N-isopropylacrylamide | PAS-5 | Polylysine |
|---|---|---|---|---|---|---|---|---|---|---|
| AL | | | | | | | | | | |
| AM | | | | | | | | | | |
| 59 | 0.005 | | | | | | | | | |
| AN | | 0.005 | | | | | | | | 3 |
| AO | | | 0.005 | | | | | | | |
| 60 | | | | 0.005 | | | | | | |
| 61 | | | | | 0.005 | | | | | |
| 62 | | | | | | 0.005 | | | | |
| AP | | | | | | | 0.005 | | | |
| AQ | | | | | | | | 0.005 | | |
| 63 | | | | | | | | | 0.005 | |
| 64 | | | | | | | | | | 0.005 |

Note:
PAS-5 was Diallylamine hydrochloride acrylamide copolymer from Nitto Boseki Co. Ltd.

TABLE 16.1

| Slurry | Static Etching Rate (Å/min) |
|---|---|
| AL | 438.4 |
| AM | 307.9 |
| 59 | 3.6 |
| AN | 244.7 |
| AO | 252.7 |
| 60 | 15.8 |
| 61 | 0.4 |
| 62 | 90.1 |
| AP | 217.6 |
| AQ | 338.8 |
| 63 | 5.6 |
| 64 | 101.7 |

These data indicated that when molybdic acid is present, anionic and nonionic polymers did not function as a corrosion inhibitor for controlling tungsten static etch rates. However, cationic nitrogen-containing polymers can reduce the tungsten static etching rate to low levels. In particular, these polymers can achieve greater than fifty percent reductions in static etch rates.

Example 17

All samples contained 1 μM terephthalic acid and the samples were injected into ultra performance liquid chromatography right after mixing with the designated amount of hydrogen peroxide. The expected end-product, hydroxy terephthalic acid ("HPA") was used to reflect the amount of hydroxyl radical formation. The HPA was identified (effluent peaks were measured at an initial interval of 5.1 minutes and subsequent intervals of 4.5 minutes.) These peaks were then quantified by the Mass Spec Extracted ion chromatograms.

The reaction of the hydroxyl radical with HPA is as follows:

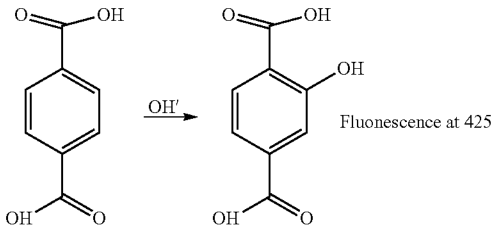

Terephthalic aicd

Hydroxyl terephthalic aicd

TABLE 17

| Sample | HPA Intensity by UPLC/Mass | HPA concentration |
|---|---|---|
| 1% $H_2O_2$ | 0 | 0 |
| 100 ppm C 2-2 + 1 wt % $H_2O_2$ | 0 | 0 |
| 100 ppm C 2-2 + 0.012 μM Molybdic acid + 1 wt % $H_2O_2$ | 1.7 | ~0.01 μM |
| 100 ppm C 2-2 + 0.02 wt % $Fe(NO_3)_2$ + 1 wt % $H_2O_2$ | 129.5 | ~1 μM |
| 0.1 μM HPA | 10.27 | |
| 1 μM HPA | 100.09 | |

The Fenton-containing sample promoted the formation of hydroxy radical. Unlike the Fenton-containing example, the Fenton-free functionalized carbon-based particles did not promote the formation of hydroxyl radical. Specifically, the Fenton-free sample did not detect the presence of hydroxyl radical. Similarly, the molybdic acid-containing sample did not promote the significant formation of hydroxy radical.

What is claimed is:

1. A chemical mechanical polishing solution for metal and metal nitride substrates comprising:

a solvent;

functionalized carbon-based particles having oxygen-containing functional groups, the functionalized carbon-based particles having oxygen-containing functional groups react with a peroxy moiety to increase oxygen to carbon atomic ratio on the functionalized carbon-based particles, the functionalized carbon-based particles containing at least 10 weight percent of an sp3-containing structure, wherein the functionalized carbon-based particles include at least 0.01 atomic percent oxygen and wherein a surface of the functionalized carbon-based particles has an atomic oxygen to carbon ratio of at least 0.01; and at least one soluble metal oxide anion wherein the metal is selected from vanadium, niobium, tantalum, chromium, molybdenum and tungsten.

2. The polishing solution of claim 1, wherein the soluble metal oxide anion is selected from the group consisting of molybdic acid, silicomolybdic acid and phosphomolybdic acid.

3. The polishing solution of claim 1 wherein the oxygen-containing functional group is a COOH and its salts, COOOH and its salts, OH—, ketone, oxirane or a combination thereof.

4. The polishing solution of claim 1, wherein the metal and metal nitride is selected from the group consisting of cobalt, copper, molybdenum, tungsten, titanium nitride and tantalum nitride.

5. The polishing solution of claim 1, further comprising an oxidizer, wherein the oxidizer is hydrogen peroxide and contains less than contained less than 0.1 μM hydroxyl radical.

6. The polishing solution of claim 1, wherein the polishing solution is iron free.

7. The polishing solution of claim 1, wherein the soluble metal oxide anion is molybdic acid.

8. The polishing solution of claim 1, wherein the functionalized carbon-based particles contain at least 30 weight percent sp3-containing structure.

9. The polishing solution of claim 1 further comprising at least one abrasive with a Mohs hardness of at least 8.

10. The polishing solution of claim 9, wherein the at least one abrasive is selected from alumina, boron nitride, silicon carbide, diamond, and mixtures thereof.

* * * * *